United States Patent
Iijima et al.

(10) Patent No.: US 6,828,224 B2
(45) Date of Patent: Dec. 7, 2004

(54) METHOD OF FABRICATING SUBSTRATE UTILIZING AN ELECTROPHORETIC DEPOSITION PROCESS

(75) Inventors: Takahiro Iijima, Nagano (JP); Akio Rokugawa, Nagano (JP); Noriyoshi Shimizu, Nagano (JP)

(73) Assignee: Shinko Electric Industries Co. Ltd., Nagano (JP)

( * ) Notice: Subject to any disclaimer, the term of this patent is extended or adjusted under 35 U.S.C. 154(b) by 122 days.

(21) Appl. No.: 10/194,326

(22) Filed: Jul. 15, 2002

(65) Prior Publication Data

US 2003/0011070 A1 Jan. 16, 2003

(30) Foreign Application Priority Data

Jul. 16, 2001 (JP) .......................................... 2001-214810

(51) Int. Cl.[7] .......................................... H01L 21/4763
(52) U.S. Cl. ...................................... 438/622; 438/667
(58) Field of Search ................................ 438/622, 106, 438/108, 118, 121, 122, 124, 666, 667, 758; 257/700–703, 773, 774, 786; 29/825, 874, 885

(56) References Cited

U.S. PATENT DOCUMENTS

| | | | | |
|---|---|---|---|---|
| 5,224,265 A | * | 7/1993 | Dux et al. | 29/852 |
| 5,786,986 A | * | 7/1998 | Bregman et al. | 361/719 |
| 6,127,283 A | * | 10/2000 | Gal-Or et al. | 438/785 |
| 6,492,201 B1 | * | 12/2002 | Haba | 438/121 |
| 6,607,645 B1 | * | 8/2003 | Sarkar | 204/483 |

FOREIGN PATENT DOCUMENTS

JP 320171 11/2001

* cited by examiner

*Primary Examiner*—Alonzo Chambliss
(74) *Attorney, Agent, or Firm*—Armstrong, Kratz, Quintos Hanson & Brooks, LLP.

(57) ABSTRACT

In a process of manufacturing a core substrate of a semiconductor package using a metal core, through holes are formed in required positions on the metal core by an etching or a punching. Then, surfaces of the metal core inclusive of inner walls of the through holes are filled with insulative resin by an electrophoretic deposition process so as to form resin films. Thereafter, conductive thin films are formed on the entire surfaces of the resin films and the insides of the through holes are filled with a conductive material.

8 Claims, 7 Drawing Sheets

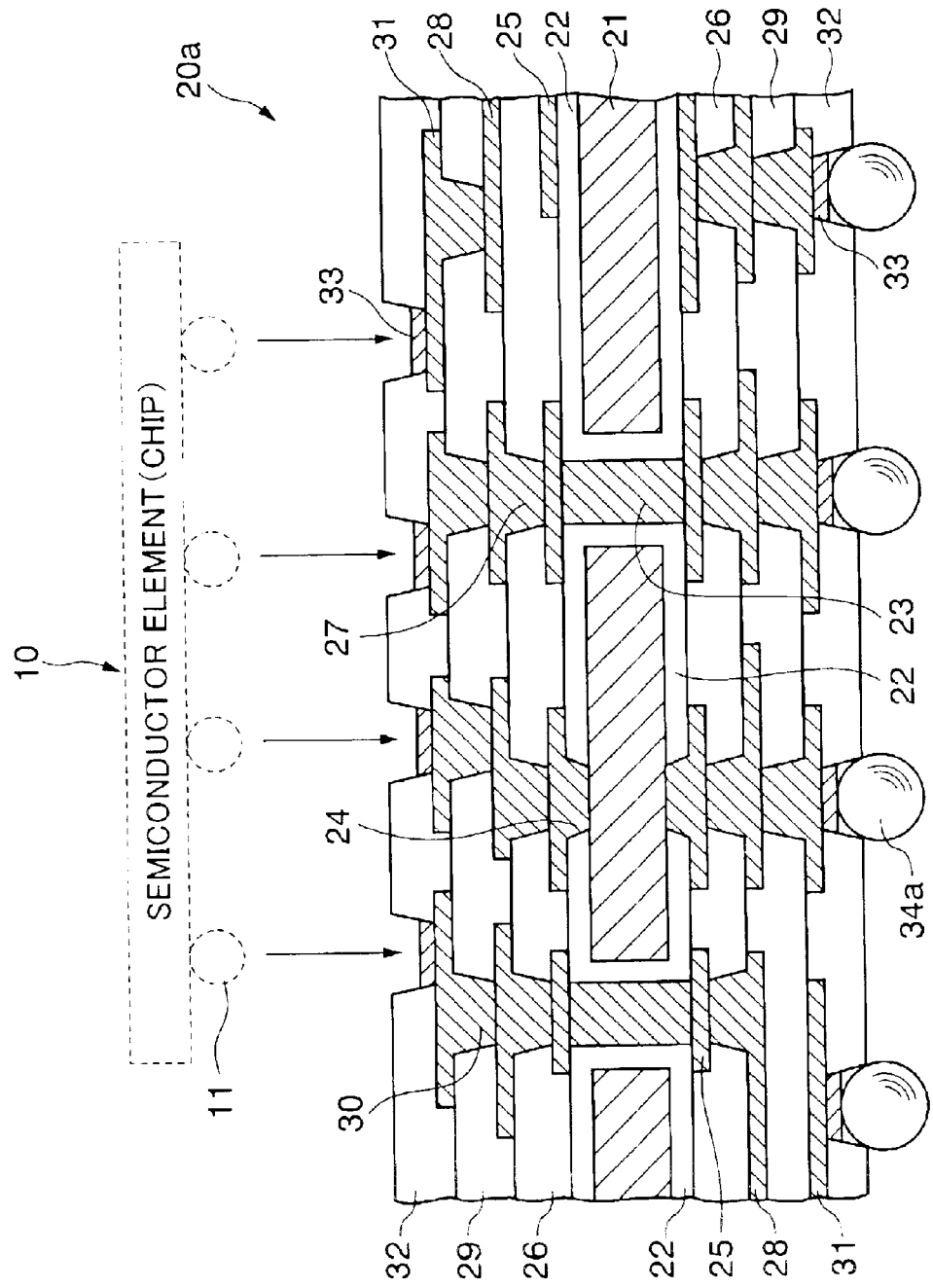

METHOD OF FABRICATING SUBSTRATE UTILIZING AN ELECTROPHORETIC DEPOSITION PROCESS

BACKGROUND OF THE INVENTION (a) Field of the Invention

The present invention relates to technologies for manufacturing wiring boards used as packages for mounting semiconductor elements thereon (hereinafter referred to as "semiconductor packages"). More specifically, the present invention relates to a semiconductor package using a metal as a core member of a printed board, a method of manufacturing the semiconductor package, and a semiconductor device. As a matter of convenience, the metal used as the core member of the semiconductor package will be hereinafter referred to as a "metal core".

(b) Description of the Related Art

Conventionally, a so-called copper-clad laminate is used as a core portion of a typical printed board (a semiconductor package). The copper-clad laminate includes a core formed by stacking a required number of glass-fabric sheets impregnated with insulative resin (such as epoxy resin, polyimide resin, BT resin, PPE resin or the like), and a copper foil(s) attached to one or both surfaces thereof, in which the foregoing members are laminated by applying heat and pressure.

In the prior art, upon manufacturing a semiconductor package using such a copper-clad laminate, a core substrate thereof has been manufactured in accordance with the manufacturing steps as exemplified in FIG. 1A to FIG. 1D. Specifically, the core substrate of the package has been manufactured by: preparing a copper-clad laminate 3 by attaching copper foils 2 on both surfaces of an insulative core member 1 (FIG. 1A); forming through holes 4 in required positions of the copper-clad laminate 3 (FIG. 1B); forming a copper (Cu) thin film 5 on the entire surface of the copper-clad substrate 3 inclusive of inner surfaces of the through holes 4 (FIG. 1C); and filling the insides of the through holes 4 with a conductive material 6 (Cu) (FIG. 1D).

Although a process subsequent thereto is not particularly illustrated throughout FIG. 1A to FIG. 1D, a typical process to be carried out includes the steps of planarizing both surfaces of the core substrate, forming a wiring layer (inclusive of pads) by forming a Cu layer on the entire surface of the core substrate and then patterning the Cu layer into appropriate patterns by photolithography, forming a resin layer (an insulating layer) on the entire surface including the wiring layer, forming a via hole in a required position on the resin layer such that the via hole reaches a pad on a lower layer in the corresponding position, repeating formation of the wiring layers, the resin layers and the via holes until constituting a required number of layers and thereby forming a wiring layer (inclusive of pads) on the outermost layer ultimately, forming a protective film on the entire surface and forming openings in the protective film in positions corresponding to pads on a lower layer, bonding external connection terminals (such as pins or solder balls) to pads exposed from the openings, and the like.

According to the prior art process, the core substrate of the semiconductor package is manufactured by the steps such as described in FIG. 1A to FIG. 1D, in which the glass fabrics impregnated with the insulative resin are used for the copper-clad laminate 3 as the core. Therefore, a mechanical drill or a laser (a $CO_2$ laser, an excimer laser, or the like) needs to be used for drilling the through holes 4.

On the other hand, semiconductor packages in recent years have been required to realize high density; therefore, wiring patterns therein are made close to each other. As a result, the semiconductor packages tend to incur problems such as occurrence of crosstalk noises between the wiring patterns or fluctuation of an electric potential of a power supply line or the like. In particular, a package for mounting a high-frequency semiconductor element, which has to effectuate a high-speed switching operation, tends to incur crosstalk noises according as the frequency increases. Moreover, switching noises are incurred by a switching element being turned on and off rapidly, whereby the electric potential of the power supply line or the like tends to fluctuate.

Conventionally, as a remedy for the foregoing problem, capacitor elements such as chip capacitors have been annexed to a package mounting a semiconductor element, whereby a signal line or a power supply line thereof has been "decoupled".

In this case, however, the degree of freedom of design of wiring patterns may be restricted because of provision of the chip capacitors, or an increase in inductance may be incurred because a line distance of the wiring pattern for connecting between the chip capacitor and a power-source/ground terminal of the semiconductor element is lengthened. A decoupling effect by the chip capacitor is degraded where the inductance is large. Therefore, it is preferred that the inductance is made as small as possible. In other words, it is preferred that the capacitor element such as the chip capacitor is disposed as close to the semiconductor element as possible.

Moreover, since the capacitor elements such as the chip capacitors are annexed to the package, the package may become larger as a whole or heavier. Such an increase in size or weight goes against the recent trend for downsizing and weight saving of semiconductor packages.

Instead of annexing the capacitor elements such as the chip capacitors to the package, one conceivable remedy for dealing with such inconvenience is to provide equivalent capacitor elements (capacitor portions) inside the package.

Conventionally, as technology for providing the capacitor portions inside the packages, there have been taken approaches such as laminating a sheet member as a dielectric layer of the capacitor portions between wiring layers, with inorganic filler mixed thereinto for increasing dielectric constant.

As described above, according to the conventional process of manufacturing the semiconductor package, the copper-clad laminate is used as its core portion and the through holes are drilled in the copper-clad laminate by a processing apparatus using a mechanical drill or the like. Therefore, the drilling process depends on processing performance of the processing apparatus, and reduction in hole sizes (diameters) of the through holes are technically limited. Accordingly, there has been a problem in that a through hole pitch (a distance between centers of two adjacent through holes) cannot be always narrowed enough to satisfy a required pitch.

Incidentally, in the case of using a mechanical drill, for example, the smallest diameter of the through hole available in the state of the art is limited to a range from about 300 $\mu$m to 200 $\mu$m. In the example shown in FIG. 1A to FIG. 1D, the diameter of each through hole 4 is 200 $\mu$m. In this event, the through hole pitch is set to 400 $\mu$m. Also, the thickness of the copper-clad laminate 3 is 250 $\mu$m.

Where the through hole pitch cannot be narrowed to a required degree, a high densification of wirings in a semiconductor package will be inhibited. Eventually, it becomes difficult to achieve micro fabrication of wirings.

It is predicted that higher densification of wirings (micro fabrication of wirings) in semiconductor packages will be further demanded. Under these circumstances, technology for further narrowing the through hole pitch is therefore required. However, as described above, it has not been always possible to meet the demands currently because of dependency on processing performance of the processing apparatus.

Moreover, there have been disadvantages in that the use of the copper-clad laminate increases material costs and that requirement of the step of drilling the through holes on the copper-clad laminate using the mechanical drill or the like increases equipment costs (and eventually manufacturing costs).

On the other hand, where the capacitor elements (the capacitor portions) for exerting the decoupling effect are provided inside the package, in the prior art, the sheet member made of a high-dielectric material is laminated between the wiring layers as the dielectric layer of the capacitor portions. Accordingly, a film thickness of an insulating film between the wiring layers needs to be thickened more than the thickness of the dielectric layer, and accordingly there has been a disadvantage in that the interlayer insulating layer cannot be sufficiently thinned. Such a disadvantage inhibits realization of a low-profile semiconductor package, and a thick interlayer insulating layer goes against the need of the age, which is to provide a high-packaging-density semiconductor device while thinning the thickness of the entire package. In addition, costs for the interlayer insulating layer are increased more as the film thickness grows more. Eventually, there has been a problem of an increase in costs for manufacturing the package.

SUMMARY OF THE INVENTION

An object of the present invention is to provide a semiconductor package, a method of manufacturing the semiconductor package and a semiconductor device, which are capable of manufacturing a core substrate without performing through hole drilling using a mechanical drill or the like, thereby realizing a high-density micro fabrication of wiring and contributing to a reduction in fabrication costs.

Another object of the present invention is to provide a semiconductor package, a method of manufacturing the semiconductor package and a semiconductor device, which are capable of inner-packing capacitor portions for exerting a decoupling effect without inhibiting realization of a low-profile package or increasing fabrication costs.

To attain the foregoing objects, according to one aspect of the present invention, there is provided a method of manufacturing a semiconductor package using a plate-like metal core as a core member, the method comprising the step of manufacturing a core substrate using the metal core, the step of manufacturing a core substrate including the steps of forming a through hole in a required position on the metal core using one of an etching and a punching, forming a resin film on a surface of the metal core inclusive of an inner wall of the through hole by coating insulative resin using an electrophoretic deposition process, forming a conductive thin film on an entire surface of the resin film, and filling an inside of the through hole with one of a conductive material and an insulative material.

According to the method of manufacturing a semiconductor package of the present invention, in the process of manufacturing the core substrate, the through hole is drilled in the metal core using the etching or the like, and the insulative resin film is formed on the metal core after drilling using the electrophoretic deposition process. Therefore, it is possible to reduce a diameter of the through hole as compared to the conventional through hole processing on a copper-clad laminate using a mechanical drill or the like. Accordingly, it is possible to reduce a though hole pitch considerably narrower. In this way, formation of high-density micro wiring becomes feasible, and reduction in manufacturing costs can be also realized.

Also, according to another aspect of the present invention, there is provided a method of manufacturing a semiconductor package, which includes, subsequently to the step of manufacturing the core substrate, the steps of planarizing both surfaces of the core substrate until the surface of the resin film is exposed, forming via holes to reach the metal core in required positions on the resin film, forming conductive layers on both surfaces of the substrate while filling insides of the via holes and then patterning the conductive layers into required patterns to thereby form first wiring layers inclusive of pads, forming insulating layers on both surfaces of the substrate inclusive of the first wiring layers, forming via holes to reach the pads of the first wiring layers in required positions on the insulating layers, forming second wiring layers inclusive of patterned pads ultimately on outermost surfaces of the substrate by forming patterned wiring layers, insulating layers and via holes sequentially until reaching a required number of layers, forming protective films on both surfaces of the substrate inclusive of the second wiring layers and forming opening in the respective protective films in positions corresponding to the pads of the second wiring layers, and bonding external connection terminals to the pads exposed from the openings formed on one of the protective films.

According to the method of manufacturing a semiconductor package in accordance with this aspect, it is possible to constitute a capacitor portion by utilizing the resin film as a dielectric layer and by utilizing the metal core (an external connection terminal to be electrically connected via the respective via holes and the first and second wiring layers) and the first wiring layer on the resin film (an external connection terminal to be electrically connected via the via holes and the second wiring layer), as electrodes, respectively.

Therefore, such presence of the capacitor portion can exert a required decoupling effect (suppression of occurrence of crosstalk noises between the wirings, fluctuation in electric potential of a power supply line, or the like). Moreover, since parts of the members constituting the package (namely, the metal core, the resin films and the wiring layers) are also used as the dielectric layers and the respective electrodes of the capacitor portions, it is not necessary to incorporate a sheet member as a capacitor portion into the package as in the prior art. This contributes to a realization of a low-profile semiconductor package and to a reduction in fabrication costs thereof.

Moreover, according to another aspect of the present invention, there is provided a semiconductor package manufactured in accordance with the above-described method of manufacturing a semiconductor package.

Furthermore, according to still another aspect of the present invention, there is provided a semiconductor device, in which a semiconductor element is mounted on an opposite surface to the surface of the semiconductor package where the external connection terminals are bonded, electrode terminals of the semiconductor element being electrically connected to pads exposed from the openings formed in the protective film.

BRIEF DESCRIPTION OF THE DRAWINGS

FIG. 4 is a cross-sectional view showing a constitution of the semiconductor package according to another embodiment of the present invention.

DESCRIPTION OF THE PREFERRED EMBODIMENTS

Figure 1A:
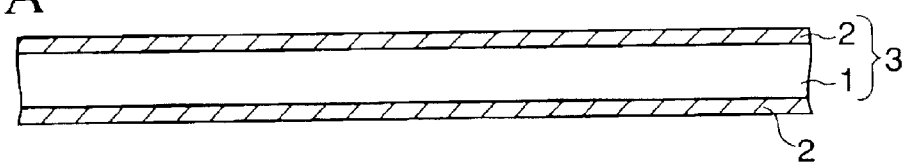
FIG. 1A to FIG. 1D are cross-sectional views schematically showing a process of manufacturing a core substrate of a semiconductor package according to the prior art.
Figure 1B:
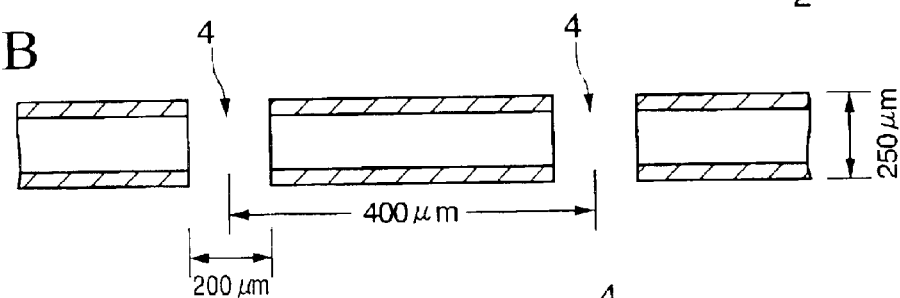
Figure 1C:
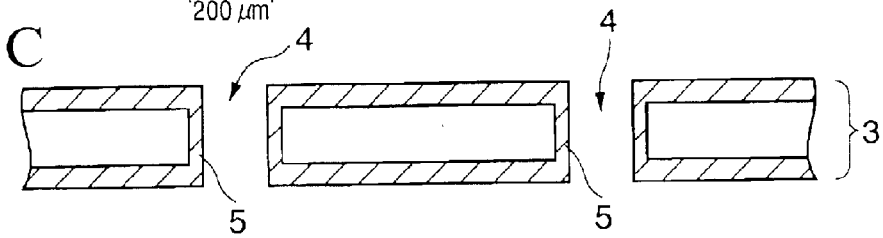
Figure 1D:
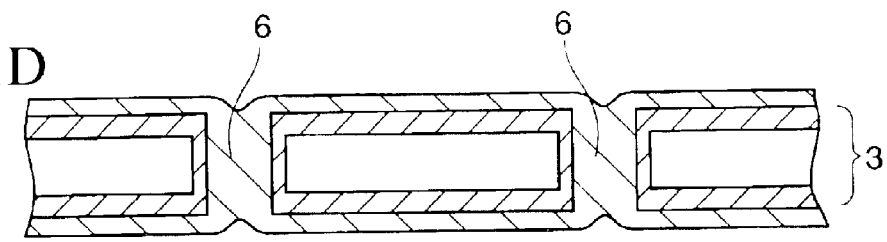
Figure 2:
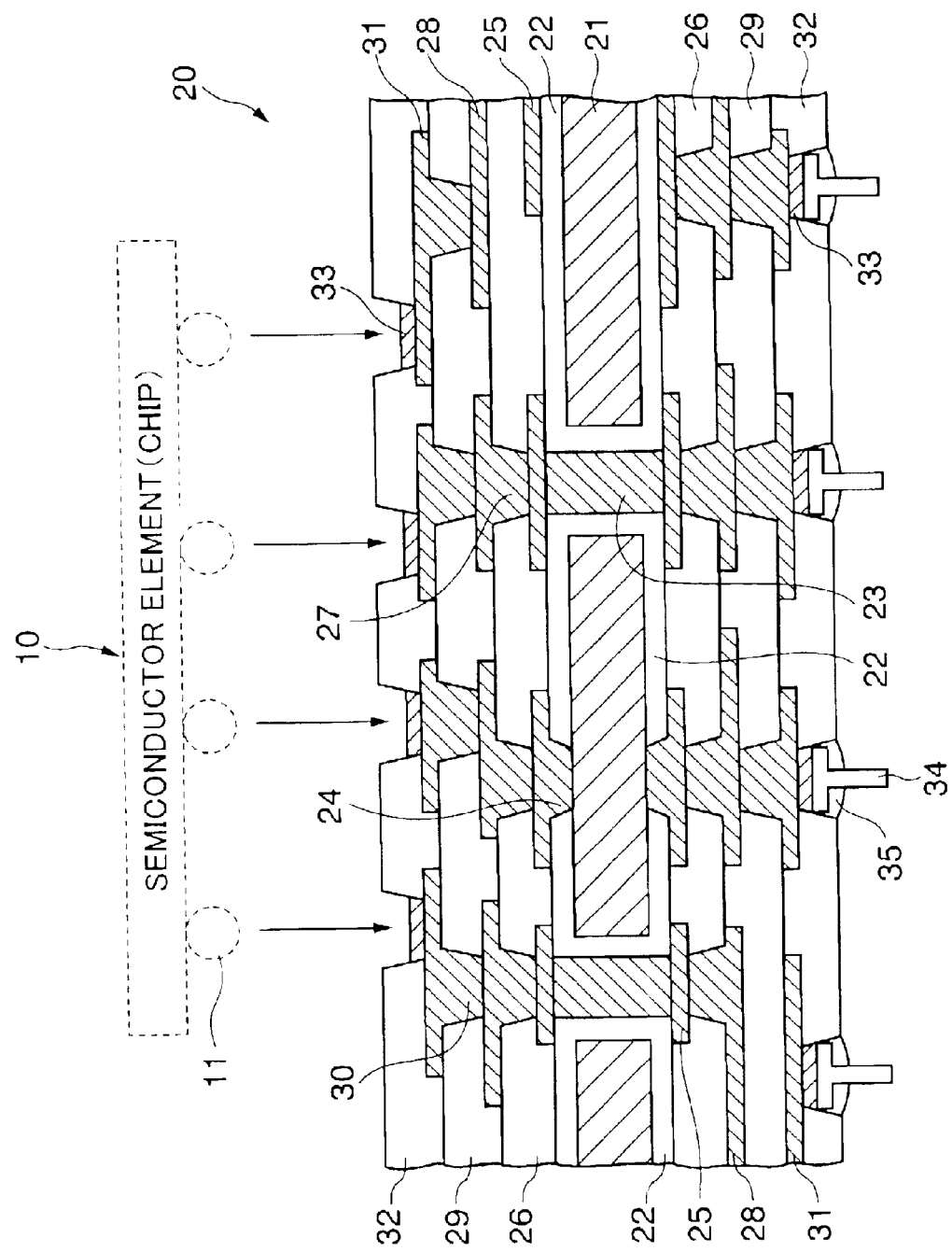
FIG. 2 is a cross-sectional view showing a constitution of the semiconductor package according to one embodiment of the present invention.

FIG. 2 schematically shows a constitution of the semiconductor package according to one embodiment of the present invention in a form of a cross-sectional view.

In the drawing, reference numeral 20 denotes a semiconductor package according to the present embodiment, which has a form of a multilayer wiring board (in the illustrated example, six-layer wiring structure) which can be formed using a build-up process, as described later. On the semiconductor package 20, a semiconductor element (chip) 10 is mounted via electrode terminals 11 (such as solder bumps, gold (Au) bumps, or the like) as illustrated with dashed lines.

In the semiconductor package 20, reference numeral 21 denotes a metal core as a core member of the package. Reference numeral 22 denotes resin films formed on surfaces of the metal core by an electrophoretic deposition process as described later. Reference numeral 23 denotes a conductive member filled in though holes formed in required positions on the metal core 21. Reference numeral 24 denotes via holes formed on the resin films 22 so as to reach the metal core 21. Reference numeral 25 denotes wiring layers (inclusive of pads) formed on the resin films 22 by filling the insides of the via holes 24 and then by patterning. Reference numeral 26 denotes resin layers (insulating layers) formed on the wiring layers 25 and on the resin films 22. Reference numeral 27 denotes via holes formed on the resin layers 26 so as to reach the pads of the wiring layers 25. Reference numeral 28 denotes wiring layers (inclusive of pads) formed on the resin layers 26 by filling the insides of the via holes 27 and then by patterning. Reference numeral 29 denotes resin layers (insulating layers) formed on the wiring layers 28 and on the resin layers 26. Reference numeral 30 denotes via holes formed on the resin layers 29 so as to reach the pads of the wiring layers 28. Reference numeral 31 denotes wiring layers (inclusive of pads) formed on the resin layers 29 by filling the insides of the via holes 30 and then by patterning. Reference numeral 32 denotes solder resist layers as protective films (insulating layers) formed so as to cover the resin layers 29 and the wiring layers 31 except portions of the pads of the wiring layers 31.

Moreover, reference numeral 33 denotes nickel (Ni)/gold (Au) plated films formed on the pads exposed from openings on the solder resist layers 32. Reference numeral 34 denotes pins used as external connection terminals on the occasion of mounting the package 20 on a substrate for mounting such as a mother board. Reference numeral 35 denotes solder for bonding the pins 34 to the coating films 33 on the pads exposed from the openings on the lower solder resist layer 32.

To the coating layer 33 on the pads exposed from the openings of the upper solder resist layer 32, the electrode terminals 11 (such as the solder bumps) of the semiconductor chip 10 on the occasion of loading the package 20 with the semiconductor chip 10 are bonded.

The semiconductor package 20 of the present embodiment is basically characterized in that the resin films 22 are formed by covering the surfaces of the metal core 21 used as the core member with insulative resin in accordance with the electrophoretic deposition process as described later. Further, the semiconductor package of the embodiment is also characterized in that capacitor portions are provided inside.

The resin film 22 constitutes a dielectric layer of the capacitor portion. Therefore, it is preferred that the resin film 22 is made of a high dielectric material. In the embodiment, the resin film 22 is made of polyimide resin mixed with inorganic filler having a high dielectric constant (which is 20 or more, for example). Moreover, the pin 34 electrically connected to the metal core 21 constitutes one electrode of the capacitor portion, and the pin 34 electrically connected to the wiring layer 25 formed on the resin film 22 constitutes the other electrode of the capacitor portion.

For example, ceramic powder of grain sizes within 5 μm is used as the inorganic filler (a dielectric material) having the dielectric constant of 20 or more. Preferably, ceramic powder having a perovskite structure (such as $BaTiO_3$, PZT, $SrTiO_3$ or the like) is used. Although commercially available dielectric powder materials can be used, it is preferred that the powder is used after thermal processing. For example, where $SrTiO_3$ is used as the dielectric powder material, it is preferred that the powder is subjected to the process at a heating temperature of 600° C. or higher in the atmosphere for one hour or longer.

Note that copper (Cu) is used as the material for the metal core 21, the conductive member 23, and the wiring layers 25, 28 and 31. Meanwhile, thermosetting polyimide resin, epoxy resin, polyphenylene ether (PPE) resin or the like, for example, is used as the resin to constitute the insulating layers 26 and 29. Moreover, Kovar (trademark) plated with Ni/Au, for example, is used as the material of the pins 34.

Now, description will be made regarding a method of manufacturing the semiconductor package 20 of the present embodiment with reference to FIG. 3A to FIG. 3M, which sequentially illustrate the manufacturing steps thereof.

In the first step (FIG. 3A), the metal core 21 made of Cu in a thickness of about 200 μm is prepared, and through holes 40 are formed in required positions thereon. The though holes 40 are formed using an etching or a punching.

For example, in the case of the etching, a dry film 41 as photoresist is attached to one surface of the metal core 21 by thermo-compression bonding as exemplified on the right side of the drawing. Subsequently, exposure and development (patterning of the dry film 41) are conducted using a mask (not shown) so as to correspond to shapes of the through holes 40, whereby portions of the dry film 41 corresponding to the through holes 40 are opened (formation of openings 42). Thereafter, part of the metal core 21 corresponding to regions of the openings 42 is removed by wet etching using an alkaline solution. Lastly, the dry film 41 is separated and removed.

Note that Cu is used as the material of the metal core 21 in the embodiment. However, instead of Cu, aluminum (Al), stainless steel (SUS) or the like may be also used.

In the next step (FIG. 3B), polyimide resin is used to cover entire surfaces of the metal core 21 including inner walls of the through holes 40 by an electrophoretic deposition process, whereby resin layers 22 are formed.

Specifically, as shown in the right side of the drawing, a solvent (such as isopropyl alcohol) containing colloidally dispersed polyimide resin (inorganic filler composition) is prepared in an electrolytic bath 50 and the metal core 21 is soaked into the electrolytic bath 50. Then, an electric field (a power source 51) of given magnitude is applied between the electrolytic bath 50 and the metal core 21 while using both members as electrodes, whereby the electric field causes electrophoresis of the colloid and the surfaces (inclusive of the inner walls of the through holes 40) of the metal core 21 is coated with the polyimide resin (formation of the resin films 22).

The thickness of the resin film 22 to coat with is determined on the basis of magnitude and time of an electric current supplied from the power source 51. In this embodiment, the thickness is set to about 20 μm.

In the next step (FIG. 3C), thin-film Cu layers 60 are formed on the entire surfaces of the resin films 22 coating the surfaces of the metal core 21 by sputtering or electroless plating of Cu.

In the next step (FIG. 3D), the through holes 40 are filled with the conductive member 23 (which is Cu in this case). Such a process is conducted using an electrolytic plating or a printing method.

In the case of the electrolytic plating, for example, by electrolytic plating of Cu using the thin-film Cu layer 60 formed in the precedent step as a feeding layer, the inside of the through hole 40 is filled up and a Cu layer 23 is thereby formed on the thin-film Cu layer 60. In the case of the printing method, copper paste is coated by screen printing, and the inside of the through hole 40 is filled up accordingly.

The core substrate of the package is manufactured by the foregoing steps.

Figures 3A, 3B, 3C, 3D:
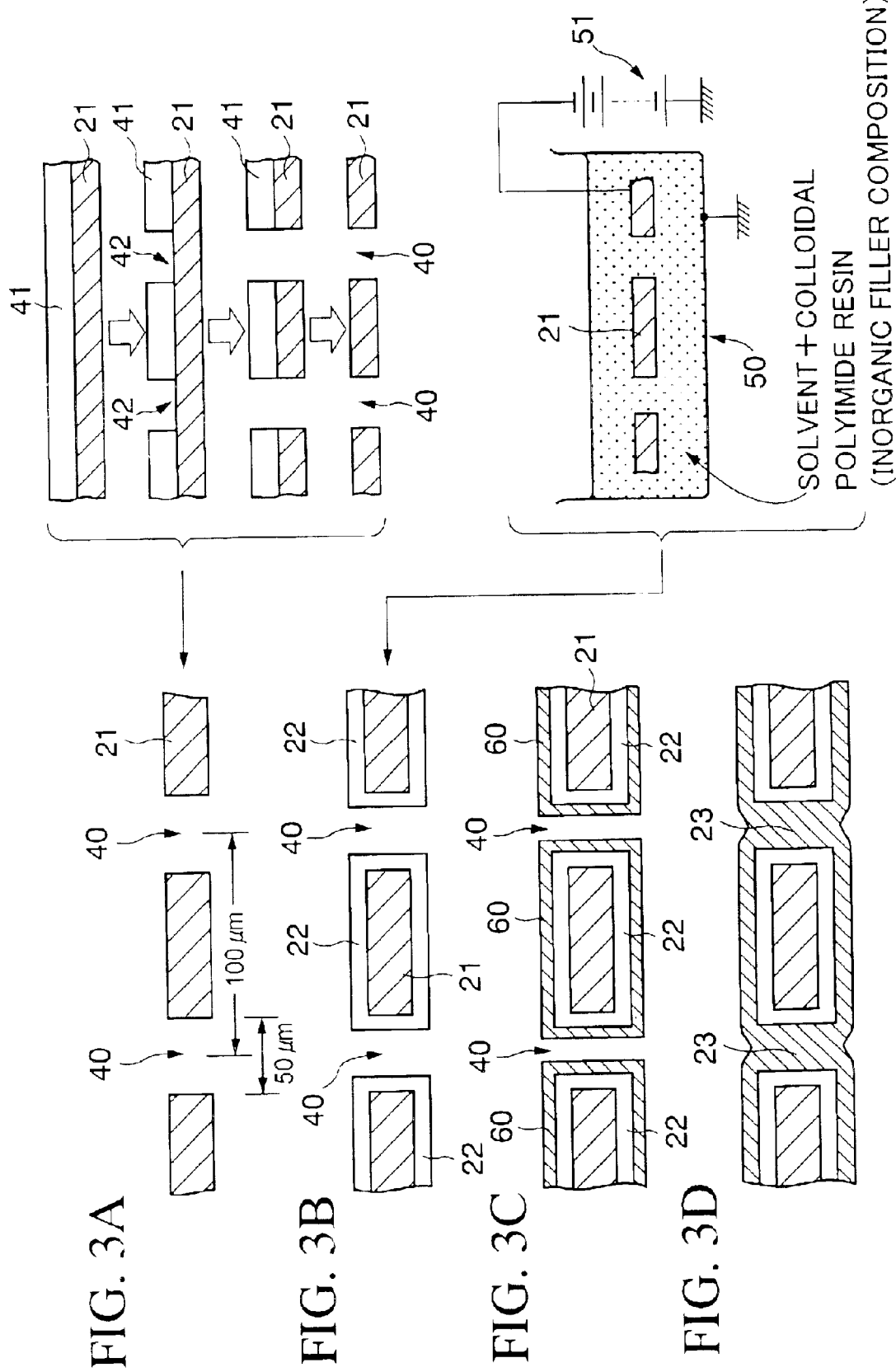
FIG. 3A to FIG. 3M are cross-sectional views showing a process of manufacturing the semiconductor package shown in FIG. 2.
Figure 3E:
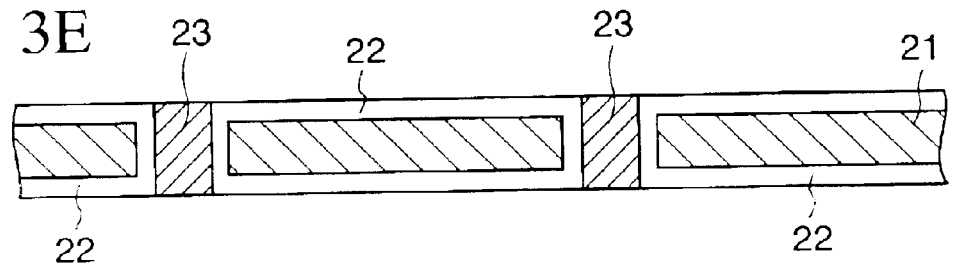

When the inside of the through holes 40 are filled up in the step illustrated in FIG. 3D, small dimples are formed on surfaces of the Cu layers 23 corresponding to the positions of the through holes 40 as shown in the drawing. In other words, uneven portions remain on the surfaces of the Cu layers 23.

In the next step (FIG. 3E), the uneven portions on the surfaces of the Cu layers 23 are polished by mechanical polishing, for example. In this way, both surfaces of the core substrate are planarized until surfaces of the resin films 22 are exposed.

In the next step (FIG. 3F), via holes 24 of frustum shapes are formed in required positions on the resin films 22 so as to reach the metal core 21 by a drilling process with a laser, for example. The laser usable therein includes a YAG laser, a CO2 laser, an excimer laser or the like.

In the next step (FIG. 3G), electrolytic plating of Cu is conducted using the metal core 21 and the conductive member 23 filled inside the through holes 40 as feeding layers, whereby the inside of the via holes 24 are filled up and Cu layers are formed on the entire surfaces. Then, the Cu layers are patterned into required shapes by photolithography, whereby wiring layers 25 (inclusive of pads) are formed. The wiring layers 25 constitute first wiring layers on upper and lower sides sandwiching the core substrate.

In the next step (FIG. 3H), thermosetting polyimide resin is applied to the entire surfaces of the resin layers 22 and of the wiring layers 25, and the polyimide resin is cured with heat so as to form resin layers (insulating layers) 26.

Figure 3F:
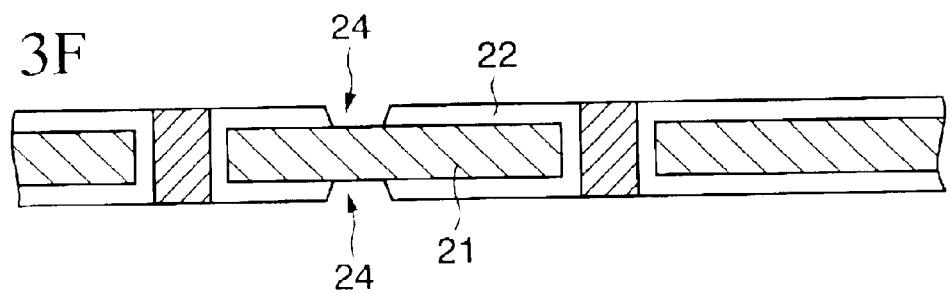

In the next step (FIG. 3I), via holes 27 of frustum shapes are formed in required positions on the resin layers 26 so as to reach the pads (the wiring layers 25) therebelow in the way similar to the processing performed in the step of FIG. 3F.

Figure 3G:
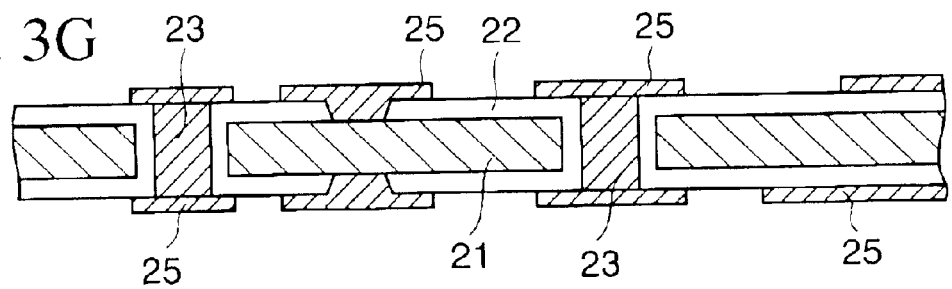
Figure 3H:
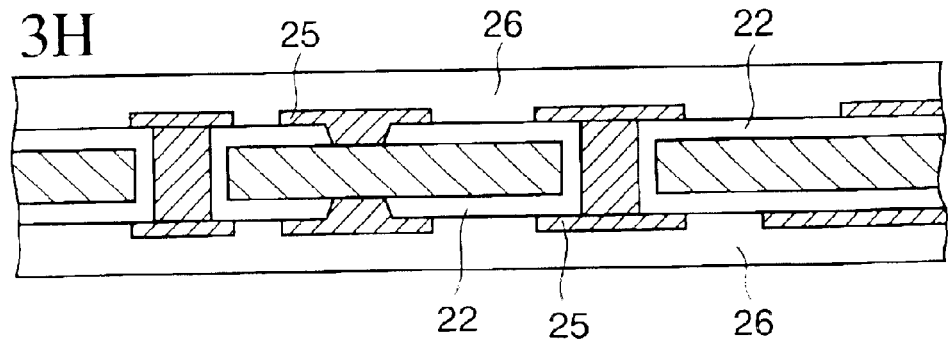
Figure 3I:
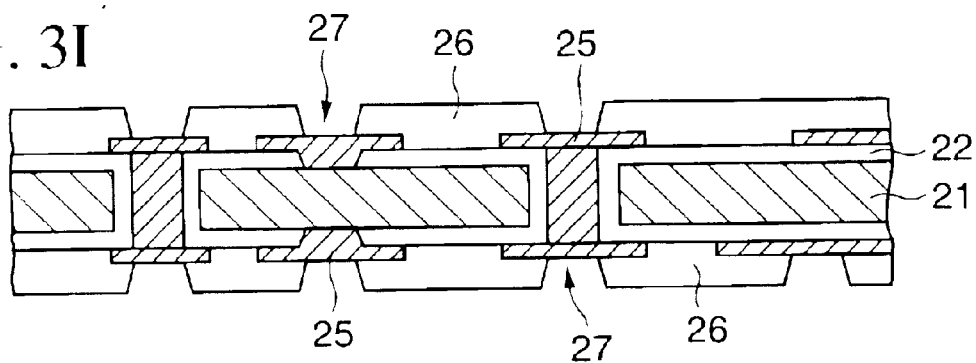
Figure 3J:
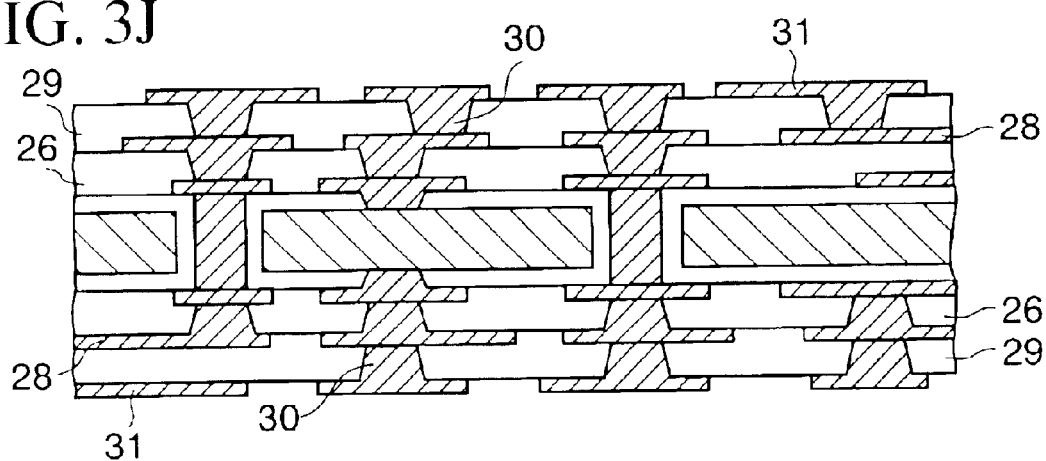
Figure 3K:
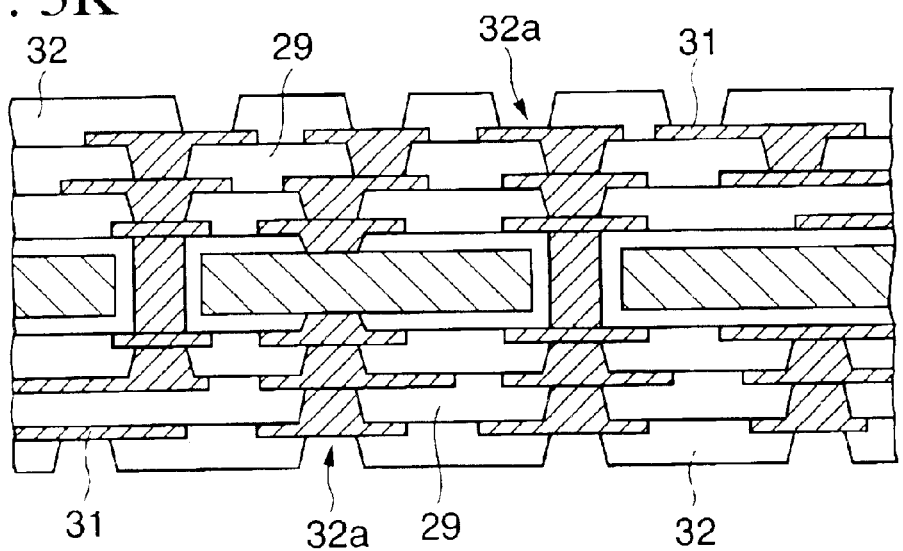
Figure 3L:
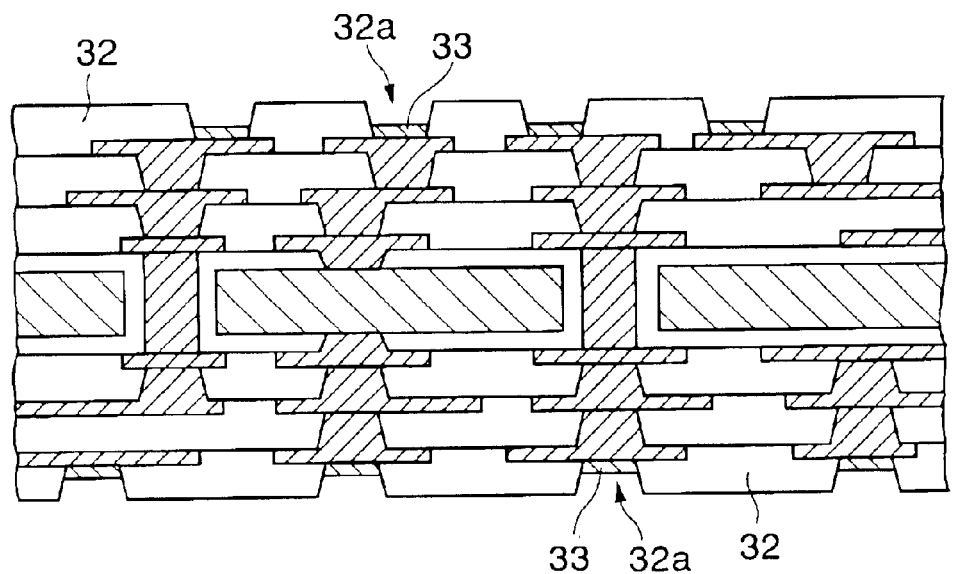
Figure 3M:
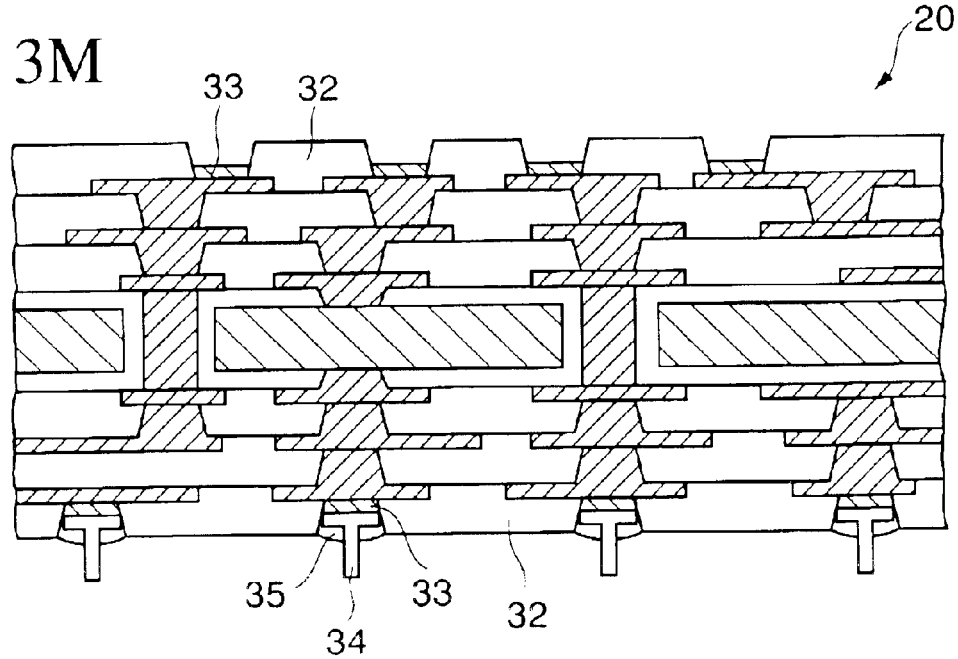

In the next step (FIG. 3J), formation of wiring layers, resin layers and via holes are repeated sequentially in the way similar to the processings conducted in the steps from FIG. 3G to FIG. 3I, and outermost wiring layers 31 (inclusive of pads) are formed ultimately.

Specifically, wiring layers 28 (inclusive of pads) are formed by patterning on the resin layers 26 as well as inside the via holes 27, and then resin layers 29 are formed on the resin layers 26 and the wiring layers 28. Thereafter, via holes 30 are formed in required positions on the resin layers 29 so as to reach pads (the wiring layers 28) thereunder, and lastly, the outermost wiring layers 31 (inclusive of pads) are formed by patterning on the resin layers 29 as well as inside the via holes 30.

Here, the wiring layers 28 constitute second wiring layers on upper and lower sides sandwiching the core substrate, and the wiring layers 28 are electrically connected to the first wiring layers 25 via the conductive member (Cu) filled in the via holes 27. Similarly, the wiring layers 31 constitute third wiring layers on upper and lower sides sandwiching the core substrate, and the wiring layers 31 are electrically connected to the second wiring layers 28 via the conductive member (Cu) filled in the via holes 30.

In the next step (FIG. 3K), solder resist layers 32 as protective films are formed on the entire surfaces of the resin layers 29 and of the wiring layers 31, and openings 32a are formed in the solder resist layers 32 in positions corresponding to pads (the wiring layers 31) thereunder.

To be more precise, photosensitive solder resist is applied (formation of the solder resist layers 32) to the entire surfaces of the resin layers 29 and of the wiring layers 31 by screen printing, for example. Then, each of the solder resist layers 32 is subjected to exposure and development (patterning of the solder resist layers 32) using a mask (not shown) patterned into shapes of the pads on the corresponding wiring layer 31, thus opening portions of the relevant solder resist layer 32 corresponding to the pads thereunder (formation of the openings 32a). In this way, only the pads of the wiring layers 31 are exposed from the openings 32a and all other portions are covered with the solder resist layers 32.

In the next step (FIG. 3L), Ni and Au plating are sequentially performed on the pads (the wiring layers 31) exposed from the openings 32a of the solder resist layers 32 by electrolytic plating while using the pads as feeding layers, whereby Ni/Au plated films 33 are formed.

Such formation of the Ni/Au plated films 33 contributes to an improvement in adhesion to the pads (the wiring layers 31) and to an enhancement in conductivity upon bonding to the pins 34 in the next step and conductivity upon bonding to the electrode terminals 11 of the semiconductor chip 10 in the step thereafter.

In the final step (FIG. 3M), the Ni/Au plated films 33 on the respective pads exposed from the openings 32a on the lower solder resist layer 32 are bonded to the pins 34 as the external connection terminals.

Specifically, certain amounts of paste solder 35 are put on the Ni/Au plated films 33 on the respective pads, and the T-shaped pins 34 having heads as large as diameters of the respective openings 32a are disposed in a manner that the heads are located downward (located upward in the illustrated example, because the semiconductor package 20 is turned over after finishing the relevant step). Thereafter, the solder 35 is hardened by reflow and the pins 34 are thereby fixed.

The semiconductor package 20 (FIG. 2) of the embodiment is manufactured by the foregoing steps.

In the method of manufacturing the semiconductor package 20 as described above, the step illustrated in FIG. 3D is described as to the case of filling the inside of the through holes 40 with the conductive member 23. On the contrary, as to through holes not required to connect the upper side and the lower side of the substrate via the metal core 21, such through holes are filled with an insulative member (resin such as thermosetting polyimide resin, epoxy resin, or the like).

When a semiconductor device is obtained by mounting the semiconductor chip 10 on the semiconductor package 20 of the embodiment, the chip 10 is mounted in such a manner that the electrode terminals 11 (such as the solder bumps) of the chip 10 are electrically connected to the Ni/Au plated films 33 on the respective pads exposed from the openings 32a of the solder resist layer 32 on the upper side of the package 20. Such a mounting process can be performed using flip-chip mounting processes such as an ACF mounting process using an anisotropic conductive film (ACF).

Moreover, when the package 20 is mounted on a substrate for mounting such as a mother board, certain amounts of paste solder are put on the corresponding pads of the substrate, then, the legs of the pins 34 are placed thereon and the solder is hardened by reflow to thereby connect the both members electrically.

As described above, according to the semiconductor package 10 of the embodiment and to the manufacturing method thereof, through holes 40 are drilled on the metal core 21 by the etching or the like (FIG. 3A), and the polyimide resin films 22 are formed on the drilled metal core 21 by electrophoretic deposition process (FIG. 3B) for manufacturing the core substrate. Therefore, it is possible to reduce diameters of the through holes 40 as compared to the conventional method (of performing through hole processing on a copper-clad laminate using a mechanical drill or the like). Accordingly, it is possible to set pitches of the through holes 40 considerably narrower. In the illustrated example, the diameter of each through hole is set to about 50 µm and the pitch between the through holes is set to about 100 µm.

In this way, a high-density micro fabrication of wiring becomes feasible, and a reduction in fabrication costs can be also realized.

Moreover, the capacitor portions are formed by setting the resin film 22 as the dielectric layer, setting the external connection terminal 34 electrically connected to the metal core 21 via the via holes 24, 27 and 30 and the wiring layers 25, 28 and 31 as one electrode, and setting the different external connection terminal 34 electrically connected to the wiring layer 25 on the resin film 22 via the via holes 27 and 30 and the wiring layers 28 and 31 as the other electrode. Accordingly, the capacitor portion can exert a required decoupling effect (suppressing occurrence of crosstalk noises in the wiring, fluctuation in electric potential of a power supply line, or the like).

Furthermore, parts of the members constituting the semiconductor package 20 (the metal core 21, the resin film 22 and the wiring layer 25) are also used as the dielectric layer or as the respective electrodes of the capacitor portions. Accordingly, it is not necessary to incorporate a sheet member as a capacitor portion into the package as in the prior art. This contributes to a realization of the low-profile semiconductor package 20 and to a reduction in fabrication costs thereof.

Although the foregoing embodiment has been described on the case of using the pins 34 as the external connection terminals for mounting the semiconductor package 20 on the mother board or the like, it is needless to say that forms of the external connection terminals are not limited to the foregoing form. For example, it is also possible to apply an ball-shaped form as observed in a ball grid array (BGA) or the like. FIG. 4 shows one example of the ball-shaped form.

FIG. 4 schematically shows a constitution of a semiconductor package 20a in the case of using solder balls 34a as external connection terminals. Since other constituents of the semiconductor package 20a are the same as those in the foregoing embodiment (FIG. 2), description thereof is herein omitted.

Moreover, the foregoing embodiments have been described while taking an example of defining the form of the semiconductor package 20 or 20a as a multilayer wiring board attributable to a build-up process. However, it is needless to say that the form of the semiconductor package is not limited to the foregoing form. As is obvious from the scope of the present invention (which is to use a metal core as a core member of a package and to form resin films on surfaces of the metal core with an electrophoretic deposition process), the present invention is equally applicable to various packages, regardless of whether the form of such a package is a multilayer wiring structure or a single-layer wiring structure, and regardless of whether the multilayer wiring structure applies the build-up process or not.

What is claimed is:

1. A method of manufacturing a semiconductor package using a plate-like metal core as a core member, the method comprising the step of:

manufacturing a core substrate using said metal core, the step of manufacturing a core substrate including the steps of:

forming a through hole in a required position on said metal core using one of etching and punching;

forming a resin film on a surface of said metal core inclusive of an inner wall of said through hole by coating insulative resin using an electrophoretic deposition process;

forming a conductive thin film on an entire surface of said resin film; and when said conductive thin film is on said entire surface of said resin film, filling an inside of said through hole with one of a conductive material and an insulative material.

2. The method according to claim 1, wherein the step of forming a resin film using an electrophoretic deposition process includes the steps of:

preparing a solvent containing colloidally dispersed organic resin in an electrolytic bath;

soaking said metal core provided with the through hole in said electrolytic bath; and applying an electric field between said electrolytic bath and said metal core to cause electrophoresis of colloid attributable to the electric field.

3. The method according to claim 2, wherein said organic resin contains a composition of inorganic filler made of a high dielectric material.

4. The method according to claim 3, wherein polyimide resin is used as said organic resin.

5. The method according to claim 3, wherein ceramic powder having a perovskite structure is used as said inorganic filler.

6. The method according to claim 1, further comprising, subsequently to the step of manufacturing a core substrate, the steps of:

planarizing both surfaces of said core substrate until the surface of said resin film is exposed, forming via holes to reach said metal core, in required positions on said resin film;

forming first wiring layers inclusive of pads by forming conductive layers on both surfaces of said substrate while filling insides of said via holes and then by patterning the conductive layers into required patterns;

forming insulating layers on both surfaces of said substrate inclusive of said first wiring layers;

forming via holes to reach the pads of said first wiring layers, in required positions on said insulating layers;

forming second wiring layers inclusive of patterned pads ultimately on outermost surfaces of said substrate by repeating forming patterned wiring layers, insulating layers and via holes sequentially until reaching a required number of layers;

forming protective films on both surfaces of said substrate inclusive of said second wiring layers and forming openings in the respective protective films in positions corresponding to the pads of the second wiring layers; and bonding external connection terminals to the pads exposed from the openings formed on one of said protective films.

7. The method according to claim 6, further comprising, between the step of forming openings in the respective protective films and the step of bonding external connection terminals, the step of forming plated films on the pads exposed from the openings of the respective protective films.

8. The semiconductor package manufactured by the method of manufacturing according to any one of claims 6 and 7.

* * * * *